United States Patent [19]

Hester et al.

[11] Patent Number: 5,675,340
[45] Date of Patent: Oct. 7, 1997

[54] CHARGE-REDISTRIBUTION ANALOG-TO-DIGITAL CONVERTER WITH REDUCED COMPARATOR-HYSTERESIS EFFECTS

[75] Inventors: Richard Knight Hester, Whitewright; William J. Bright, Dallas, both of Tex.

[73] Assignee: Iowa State University Research Foundation, Inc., Ames, Iowa

[21] Appl. No.: 418,767

[22] Filed: Apr. 7, 1995

[51] Int. Cl.$^6$ ............................................ H03M 1/12
[52] U.S. Cl. .................... 341/156; 341/118; 341/172
[58] Field of Search .......................... 341/156, 118, 341/150, 172

[56] References Cited

U.S. PATENT DOCUMENTS

| | | | |
|---|---|---|---|
| 4,072,939 | 2/1978 | Heller et al. | 340/347 |
| 4,129,863 | 12/1978 | Gray et al. | 340/347 |
| 4,195,282 | 3/1980 | Cameron | 340/347 |
| 4,196,420 | 4/1980 | Culmer et al. | 340/347 |
| 4,200,863 | 4/1980 | Hodges et al. | 340/347 |
| 4,224,605 | 9/1980 | Michaud et al. | 340/347 |
| 4,325,055 | 4/1982 | Colardelle et al. | 340/347 |
| 4,336,526 | 6/1982 | Weir | 340/347 |
| 4,348,658 | 9/1982 | Carter | 340/347 |
| 4,620,179 | 10/1986 | Cooper et al. | 340/347 |
| 4,641,129 | 2/1987 | Doluca et al. | 340/347 |
| 4,812,817 | 3/1989 | Bernard | 341/172 |
| 4,989,004 | 1/1991 | Kanayama | 341/161 |
| 5,006,853 | 4/1991 | Kiriaki et al. | 341/156 |
| 5,014,055 | 5/1991 | Dingwall et al. | 341/159 |
| 5,138,319 | 8/1992 | Tesch | 341/156 |
| 5,218,362 | 6/1993 | Mayes et al. | 341/121 |
| 5,235,333 | 8/1993 | Naylor et al. | 341/118 |
| 5,247,210 | 9/1993 | Swanson | 307/355 |
| 5,258,761 | 11/1993 | Fotouhi et al. | 341/172 |
| 5,287,108 | 2/1994 | Mayes et al. | 341/156 |
| 5,321,403 | 6/1994 | Eng, Jr. et al. | 341/168 |

OTHER PUBLICATIONS

K. Kusumoto et al., "A 10-b 20-MHz 20 mW Pipelined Interpolating CMOS ADC," *IEEE J. on Solid State Circuits*, 28, 1200–1206, Dec. 1993.

K. Kusumoto et al., "A 10-b 20-MHz 30 mW Pipelined Interpolating CMOS ADC," IEEE Int'l Solid–State Circuits Conference, Paper WP 4.3, 62–63 (1993).

S-H. Lee et al., "Digital–Domain Calibration of Multistep Analog–to–Digital Converters", *IEEE Journal of Solid–State Circuits*, 27, 1679–1688 (Dec. 1992).

T.L. Tewksbury, III et al., "Characterization Modeling, and Minimization of Transient Threshold Voltage Shifts in MOSFETs", *IEEE Journal fo Solid–State Circuits*, 29, 239–252 (Mar. 1994).

*Primary Examiner*—Todd E. DeBoer
*Attorney, Agent, or Firm*—Schwegman, Lundberg, Woessner & Kluth, P.A.

[57] ABSTRACT

Methods and apparatus for an analog-to-digital converter (ADC) with reduced comparator-hysteresis effects. One embodiment uses a charge-redistribution ADC. One method performs an initial coarse analog-to-digital conversion to avoid overdriving an analog voltage comparator. One such method includes a redundant capacitor in an array of charge-redistribution capacitors used in the ADC for sample-and-hold and successive-approximation functions. Another method performs a traditional initial successive-approximation analog-to-digital conversion, and then performs an additional conversion-step test based on the least-significant bit of the initial result to correct for comparator errors in the initial conversion.

42 Claims, 12 Drawing Sheets

CHARGE-REDISTRIBUTION ANALOG-TO-DIGITAL CONVERTER WITH REDUCED COMPARATOR-HYSTERESIS EFFECTS

FIELD OF THE INVENTION

The present invention relates to methods and apparatus for analog-to-digital conversion and more specifically to charge-redistribution capacitive analog-to-digital conversion systems.

BACKGROUND OF THE INVENTION

Charge-redistribution analog-to-digital conversion is commonly used in products today. Increased emphasis on low power consumption and mixed-signal CMOS application-specific circuits (i.e., circuits having both analog and digital signals) will result in even more reliance on charge-redistribution analog-to-digital converter (CRADC) circuit techniques.

A block diagram of a generalized prior-art successive-approximation analog-to-digital converter (ADC) 100 is shown in FIG. 1A. Within the successive-approximation logic 108 of an N-bit ADC 100 is an N-bit successive-approximation register (SAR) containing an N-bit digital value representing the approximation of the analog signal. This N-bit value is an input to the internal digital-to-analog converter (DAC) 110, the output of which, $V_{DAC}$, is compared to the analog input signal $V_{in}$ by comparator 112. The successive-approximation algorithm executed by successive-approximation logic 108 is generally an N-step binary search for the best digital approximation to the analog input. In the first step, the analog input is compared to one-half of the full-scale output of DAC 110, $V_{MAX}/2$. If the output of comparator 112 indicates that $V_{in} > V_{MAX}/2$, then the most significant bit (MSB) of the SAR is set to ONE. If not, the MSB is set to ZERO. In either case, the search space for the best digital approximation to the input signal is halved after the first step, since it is then known whether $V_{in}$ is above or below $V_{MAX}/2$. In the second conversion step, the analog input $V_{in}$ is compared to a voltage in the center of the remaining search range (i.e., $3V_{MAX}/4$ if the MSB is a ONE, $V_{MAX}/4$ if the MSB is a ZERO), and the output of comparator 112 is used to set the value of the second-most MSB. The process continues until all N bits are determined. A total of N comparator-decision cycles are required.

Comparator 112 in ADC 100 is designed to resolve very small differences between analog input $V_{in}$ and the output of DAC 110. For example, a comparator for a 10-bit ADC 100 having a maximum analog input of 5 volts (V) should be capable of resolving differences on the order of 1 millivolt (mV). This comparator-resolving capability means that comparator 112 is often grossly overdriven during the initial steps of the successive-approximation search.

For example, consider the voltage differential between the input signals at the comparator ("the comparator input voltage") during the conversion process for an exemplary 8-bit ADC 100. Table 1 (below) shows the voltage difference between $V_{in}$ and $V_{DAC}$ at each step of the eight comparator-decision cycles (one per bit) for each of four analog input voltages of $V_{in}$. The comparator input voltage differences shown correspond to conversions where no comparator errors occurred. In general, the comparator input voltage difference for an eight-bit conversion can be expressed as:

$$V_{in} + B_8(V_{MAX}/2) + B_7(V_{MAX}/4) + B_6(V_{MAX}/8) + B_5(V_{MAX}/16) + B_4(V_{MAX}/32) + B_3(V_{MAX}/64) + B_2(V_{MAX}/128) + B_1(V_{MAX}/256)$$

where $B_n$ represents the bit number of the digital approximation. The $V_{MAX}$ used to construct the example for Table 1 is 4.992V, corresponding to a least-significant-bit (LSB) step size of 19.5 mV.

TABLE 1

Comparator input differential voltage as a function of ADC input and bit step in successive approximation.

| Bit Decision | $B_8$ (MSB) | $B_7$ | $B_6$ | $B_5$ | $B_4$ | $B_3$ | $B_2$ | $B_1$ (LSB) |
|---|---|---|---|---|---|---|---|---|
| $V_{in}$ = 3.7635 V output = 193 = 11000001 | −1.2675 V decision = 1 | −19.5 mV decision = 1 | 604.5 mV decision = 0 | 292.5 mV decision = 0 | 136.5 mV decision = 0 | 58.5 mV decision = 0 | 19.5 mV decision = 0 | 0 V decision = 1 |
| $V_{in}$ = 3.744 V output = 192 = 11000000 | −1.248 V decision = 1 | 0 V decision = 1 | 624 mV decision = 0 | 312 mV decision = 0 | 156 mV decision = 0 | 78 mV decision = 0 | 39 mV decision = 0 | 19.5 mV decision = 0 |
| $V_{in}$ = 3.7245 V output = 191 = 10111111 | −1.2285 V | 19.5 mV | −604.5 mV | −292.5 mV | −136.5 mV | −58.5 mV | −19.5 mV | 0 V |
| $V_{in}$ = 3.705 V output = 190 = 10111110 | −1.209 V | 39 mV | −585 mV | −273 mV | −117 mV | −39 mV | 0 V | 19.5 mV |

The most difficult comparator decisions occur when the comparator input differential is the smallest. When $V_{in}$= 3.7635V, this occurs at the LSB ($B_1$) decision. When $V_{in}$= 3.744V, it occurs at the second-most MSB ($B_7$) decision. These examples demonstrate an important characteristic: that, given any ADC input voltage, there generally is one and only one "critical" comparator-decision cycle, where the comparator input voltage magnitude can be less than the LSB step size.

Not only does the critical-bit decision depend upon the input voltage $V_{in}$, but it also depends on the comparator overdrive history immediately preceding it. Those critical-bit decisions which are made immediately following a large overdrive, as happens in the $V_{in}$=3.744V example at the bit $B_7$ step in Table 1, are most vulnerable to threshold hysteresis-induced errors. The vulnerability to threshold hysteresis-induced errors decreases as the critical-bit decisions occur at later steps in the successive-approximation process because the comparator overdrive just prior to the critical-bit decision decreases as the critical-bit decision is made at successively less significant bit positions. The maximum possible magnitude of the comparator overdrive is progressively reduced by a factor of two at each step of the successive-approximation search.

FIG. 1B is an exemplary generalized prior-art charge-redistribution successive-approximation analog-to-digital converter 1100. Successive-approximation capacitor and switch network 111 is used to sample-and-hold analog-input voltage $V_{IN}$, and under the control of successive-approximation logic 108 redistributes the sampled charge to provide voltages which are compared by comparator 112.

TRANSISTOR THRESHOLD HYSTERESIS. When the gate voltages of metal-oxide-semiconductor field effect transistors (MOSFETs) are subjected to large changes in gate-to-source voltage, as happens when the ADC comparator is overdriven, the transistor threshold voltage suffers a small change that will persist for a period of time after the overdrive signal is removed. Both the magnitude and the duration of the transient transistor threshold voltage change is dependent upon the magnitude and duration of the overdrive condition. A more thorough theoretical and experimental discussion of this phenomenon is contained in "Characterization, Modeling and Minimization of Transient Threshold Voltage Shifts in MOSFETs," T. L. Tewksbury and H.-S. Lee, *IEEE Journal of Solid-State Circuits*, Vol. 29, No. 3, March 1994 ("the Tewksbury et al. article"). The transient threshold shift of the comparator input transistors causes a transient comparator offset. During the conversion period, the magnitude of the transient comparator offset is typically 2–3 orders of magnitude smaller than the comparator overdrive that produces it. If the transient threshold persistency (i.e., the duration of the transient transistor threshold voltage change) is not less than the time allotted for the next comparator decision, and if the comparator must resolve a small signal in the next comparator-decision cycle, then conversion errors occur.

Thus, the conversion-error mechanism of primary interest is due to a combination of the MOSFET threshold hysteresis and the comparator overdrive incidents that occur in successive-approximation ADCs. One possible solution to this is to avoid using MOSFETs in the comparator. Unfortunately, the only reasonable alternative to MOSFETs are bipolar transistors which require a relatively large input current that will discharge the signal stored on the capacitor array of charge-redistribution ADCs. Other solutions are described in U.S. Pat. No. 5,006,853 ("the '853 patent") and U.S. Pat. No. 5,247,210 ("the '210 patent"). The method in the '853 patent can be compared to method A of the present invention. The differences are highlighted in this disclosure after method A is described. The method described in the '210 patent consists of a "charge-flushing" process in the beginning of each comparator-decision cycle where a voltage is applied between the gates and common source of the comparator input devices that is said to "flush" the charge carriers responsible for the threshold hysteresis from their traps. This process is both awkward and time consuming. The present invention offers other alternatives that are based on the facts that (1) the severity of the hysteresis is strongly dependent upon the magnitude of the overdrive, and (2) the comparator has largely recovered from any overdrive by the end of the conversion. These solutions are presented in the next section of this disclosure.

Finally, it is important to understand the sign of the transient-comparator-offset shift caused by hysteresis. When the comparator is overdriven by a large positive signal, a negative transient-comparator-offset shift is produced. Likewise, a negative overdrive produces a positive transient-comparator-offset shift. The transient-comparator-offset shift acts as a voltage source in series with the comparator non-inverting input. This means that subsequent comparator output will indicate whether $V_{in} > V_{DAC} + V_{OS}(t)$, rather than whether $V_{IN} > V_{DAC}$ as desired. Here, $V_{OS}(t)$ represents the transient-comparator-offset shift as a function of time.

Consider how this affects the exemplary case in Table 1 where $V_{in} = 3.744V$. During the MSB test, the comparator is overdriven by −1.248V. During the test of the second-most MSB, the real comparator differential input is 0V, but the positive transient-comparator-offset shift makes the input appear to be greater than 0V, and therefore the comparator will mistakenly output a ZERO. Subsequent bit tests will all result in ONEs. The ADC result is 10111111 rather than the correct value of 11000000. In order to obtain an ADC result of 11000000, $V_{in}$ must be increased to 3.744 Volts+Vos($\tau_c$), where $\tau_c$ is the period of a critical comparator-decision cycle. The critical comparator decision in this example is the second-most MSB. The comparator error in this case causes a positive ADC differential nonlinearity (DNL) error for code 10111111 (decimal 191) and a negative DNL error for code 11000000 (decimal 192).

Another instructive example is when $V_{in}=1.248V$. During the MSB test, the comparator input is overdriven by +1.248V. During the test of the second-most MSB, the real comparator input is 0V, but the negative transient-comparator-offset shift makes the input appear to be less than 0V, and the comparator will output a ONE. Subsequent bit tests result in all ZEROs, and the digital output code from the ADC is 0100 . . . 00. While this is not erroneous for this input voltage, it turns out that this digital output code also results for $V_{in}$ less than 1.248V. In fact, $V_{in}$ can be as low as 1.248V−$V_{OS}(\tau_c)$ and still result in 0100 . . . 00. The critical comparator decision in this example is that for the second-most MSB. The comparator error in this case causes a negative DNL ADC error for code 00111111 (decimal 63) and a positive DNL for code 01000000 (decimal 64).

In general, the critical comparator decision corresponds to the least-significant ZERO bit if the LSB is a ONE, and to the least-significant ONE if the LSB is a ZERO.

There are a number of sources of conversion errors in charge-redistribution analog-to-digital converter (CRADC) circuits, and since the invention of CRADC circuits there has been progress in elimination of some sources of errors. As solutions for the major sources of errors are found, other error problems which had been insignificant become relatively more important.

One source of errors is the time-dependent (and voltage-dependent) threshold shift of the MOS transistors comprising the comparator input circuit. This effect is also called threshold hysteresis. A characteristic of all successive-approximation analog-to-digital converters (including CRADCs) that makes the transistor hysteresis a problem is that coarse approximations of the input signal during early steps of the successive approximation cause large overdrive of the comparator input. This overdrive produces comparator-threshold hysteresis, which in turn produces conversion errors.

U.S. Pat. No. 4,641,129 to Doluca, hereby incorporated by reference, seems to teach a coarse flash conversion, e.g., of the 8 most-significant bits, followed by a fine successive-approximation conversion, e.g., of the least-significant 4 bits, using resistor trees. A one (1), or the maximum known error for the coarse conversion, is subtracted from the value obtained from the coarse conversion value and loaded into the MSB's of the successive-approximation register (SAR). Successive tests and corrections are then done on the coarse value until those bits are corrected for any errors therein. The fine successive approximation is then done. Results are obtained in a different way than in the present invention.

U.S. Pat. No. 4,200,863 to Hodges ("the '863 patent"), hereby incorporated by reference, seems to teach an extra LSB capacitor (e.g. C/8 capacitor number 19 in FIG. 2 of the '863 patent) which maintains the total capacitance at 2C, but does not participate in an LSB correction or extra conversion cycle as in the present invention.

U.S. Pat. No. 4,620,179 to Cooper et al. ("the '179 patent"), hereby incorporated by reference, includes an up/down counter corresponding to upper-order bits in order to compensate for running the conversion clock at a higher rate than the settling time of the comparator. The ADC conversion on these upper-order bits can then be run very fast, the up-down counter is then used to adjust the upper-order result value either up or down to a more correct value after the converter is allowed sufficient time to settle, and then the lower-order bits are determined with sufficient settling time at each comparator-decision cycle. The '179 patent does not appear to teach or suggest charge-redistribution capacitor analog-to-digital conversion, nor incremental adjustment done after the lowest-order bit is determined by an initial conversion.

U.S. Pat. No. 5,235,333 to Naylor, hereby incorporated by reference, seems to use two sets of comparator amplifiers; it overdrives one set to determine the threshold shift, then uses that threshold shift as a compensating offset for the other set. Naylor provides redundant capacitors, but seems to use these for other purposes than the present invention. The present invention makes no attempt to determine the threshold shift, instead the present invention eliminates much of the threshold shift in the first place, and also provides for retesting the decision made at the crucial bit.

U.S. Pat. Nos. 5,218,362 and 5,287,108 to Mayes ("the '362 patent" and "the '108 patent" respectively), hereby incorporated by reference, do a coarse conversion starting with a 3-bit (resistor tree) estimator followed by a fine conversion done with capacitors. The conversion method used is quite different and significantly more complex than the present invention. The capacitor conversion circuits are replicated, once for each low-order bit to "successively" approximate those bits in parallel. The '362 patent seems concerned with the trimming operation and storage of correction values in a circuit memory in the A/D chip. The '108 patent seems concerned with the chip operation itself. The present invention is not described or made obvious in these references.

U.S. Pat. No. 5,138,319 to Tesch ("the '319 patent"), hereby incorporated by reference, has even and odd coarse DACs driven by resistor trees and parallel flash capacitor arrays (FIG. 7 of the '319 patent), but does not teach correction of threshold shifts nor is this reference concerned with successive approximation.

What is needed are better ways to reduce or eliminate threshold hysteresis in order to reduce conversion errors.

SUMMARY OF THE INVENTION

The present invention provides a method and apparatus for an analog-to-digital converter with reduced comparator-hysteresis effects. Some of the new inventive features of the present invention are: (A) a method including a coarse-estimate A/D first-stage conversion performed in order to eliminate much of the possible threshold-shifting overdrive of the transistors during the initial approximation sequence, followed by a second-stage fine-stepped A/D successive-approximation. In one embodiment, this is accomplished using a charge-redistribution capacitor-array circuit;

(B) an ADC circuit including a coarse-estimate A/D first-stage convertor used in order to eliminate much of the possible threshold-shifting overdrive of the transistors of the comparator, which is then used for a second-stage fine-stepped A/D successive-approximation. In one embodiment, this circuit includes a charge-redistribution capacitor-array circuit;

(C) an ADC circuit including a redundant capacitor at the LSB position of the above coarse-estimate A/D value, means to provide a subtraction of 1 from the initial coarse-estimate A/D value, and means to perform a final combination of the digital (coarse-estimate value less 1) and the fine-stepped A/D successive-approximation value;

(D) a method including a redundant successive-approximation test after the LSB position of a fine-stepped A/D successive approximation is first determined, comprising an addition of 1 to the original value if the LSB of that original value was 1 (and no change to the original value if the LSB was 0), followed by a final decision cycle which decides whether to keep the original value or an adjusted-by-one value as the final value, wherein the adjustment-by-one includes:

(1) if the LSB was one, then if the incremented value is too high, then using the original value; else using the incremented value;

or (2) if the LSB was zero, then if the first determined value is too high, then using a decremented-by-one value; else using the original value;

(E) an ADC circuit including a redundant capacitor at the LSB position of a fine-stepped A/D successive-approximation, a final decision cycle which applies $V_{MAX}$ to the "non-common" plate of the redundant capacitor if the initial LSB is ONE or which applies GROUND to the "non-common" plate of the redundant capacitor if the initial LSB is ZERO, and decides whether to keep the first-determined value or to adjust-by-one the final value.

DESCRIPTION OF THE PREFERRED EMBODIMENT

In the following detailed description of the preferred embodiments, reference is made to the accompanying drawings which form a part hereof, and in which are shown, by way of illustration, specific embodiments in which the invention may be practiced. It is to be understood that other embodiments may be utilized and structural changes may be made without departing from the scope of the present invention.

Figure 2:
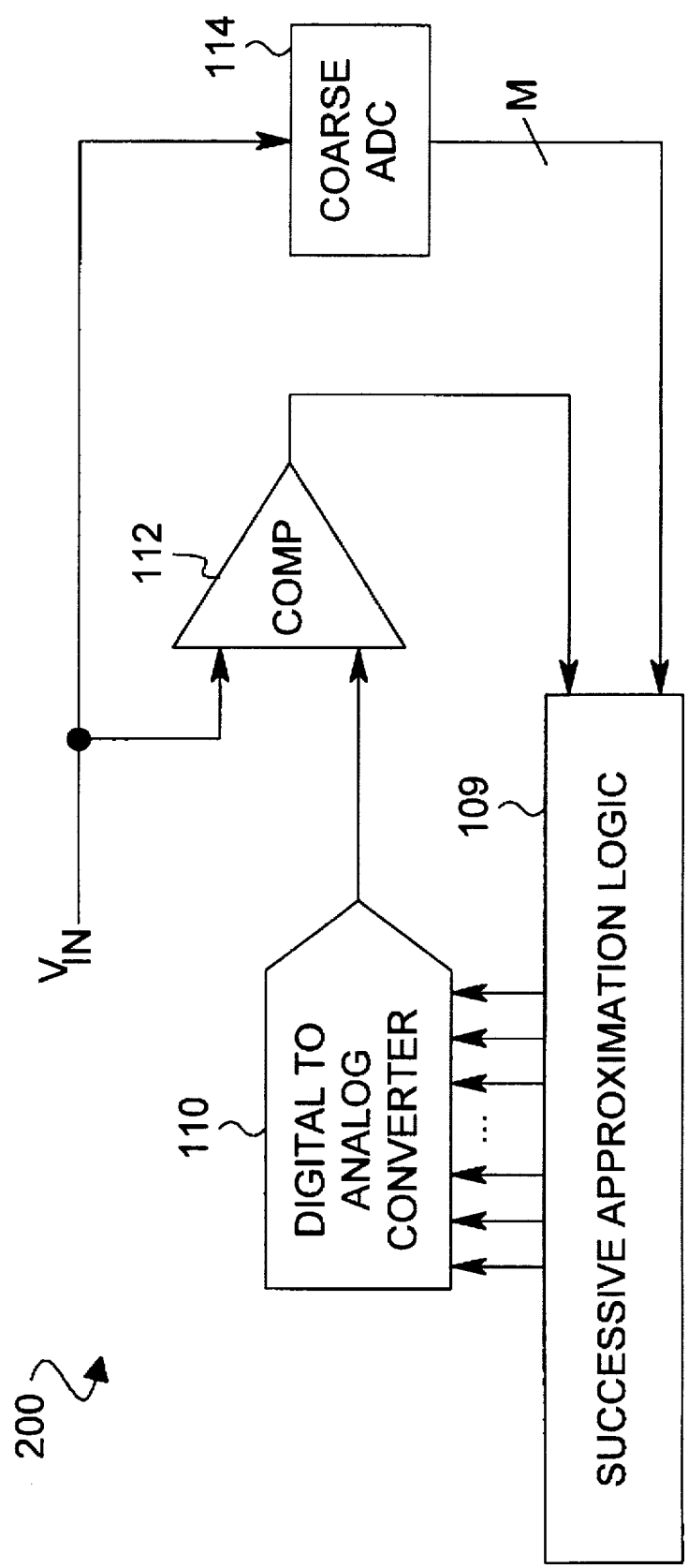
FIG. 2 is a block diagram of an exemplary analog-to-digital converter 200 with a coarse ADC used to reduce comparator-hysteresis effects.

One embodiment of an analog-to-digital converter with reduced comparator-hysteresis effects while converting an input analog signal into an output digital value according to the present invention is illustrated in FIG. 2. Input analog signal $V_{in}$ is coupled to a first input of comparator 112, and also to the input of coarse ADC converter 114 which generates a plurality of M bits corresponding to M most-significant bits of the output digital value on said coarse output, wherein M is less than N. Successive-approximation logic 109 has a first input connected to said output of comparator 112, a second input connected to the output of coarse ADC converter 114, and an N-bit digital output. Digital-to-analog converter 110 has an input connected to the N-bit digital output of successive-approximation logic 109 and an analog output connected to a second input of comparator 112.

Method A

The greatest overdrive is possible in the first conversion step when the MSB is determined, when the magnitude of the overdrive can be as large as $V_{MAX}/2$. Thereafter, the maximum possible overdrive is halved at each succeeding step, thus being $V_{MAX}/4$ in step two, $V_{MAX}/8$ in step three, and so on. If the successive-approximation algorithm can begin with the knowledge of, for example, the three most-significant bits by using a three-bit coarse ADC, then the worst-case comparator overdrive is limited to $\pm V_{MAX}/16$. This amounts to only 312.5 mV when $V_{MAX}=5V$, a magnitude that is generally sufficiently small to make the hysteresis effect negligible for converters having resolutions up to 16-bits.

The strategy behind the modified ADC architecture described for this embodiment, shown in FIG. 2, is to limit the magnitude of the worst-case overdrive. The method described here is generally applicable to many types of ADC circuits. In one embodiment, charge-redistribution circuitry is used in digital-to-analog converter 110. To limit the magnitude of the worst-case overdrive, a coarse ADC is added to the traditional charge-redistribution architecture. When the analog input signal is being sampled onto the capacitor array of the charge-redistribution converter, the coarse ADC determines an M-bit approximation of the input signal. After sampling, the successive-approximation algorithm begins with this M-bit approximation made by the coarse converter. Because the overdrive resulting from the use of this M-bit approximation is limited to $V_{MAX}/2^M$, the severity of the ADC errors due to hysteresis is reduced. One embodiment of the present invention employs the minimum value of M that guarantees the ADC error will not exceed a specified limit.

The architectural changes described above, in some sense, turn the converter into a two-stage architecture, the first stage being performed by the coarse ADC and the second stage being performed by the subsequent steps of successive approximation. One architecture related to that of the present invention is described in "Digital-Domain Calibration of Multistep Analog-to-Digital Converters," S.-H. Lee and B.-S. Song, IEEE Journal of Solid-State Circuits, Vol. 27, No. 12, December 1992 ("the S.-H. Lee et al. article"). The differences are that (A) In the S.-H. Lee et al. article, the first step of conversion is performed after the signal is sampled onto the capacitor array rather than being done simultaneously with sampling. (B) In the S.-H. Lee et al. article, the capacitor array is employed as a multiplying DAC, and the capacitor array therefore requires an output buffer amplifier which limits the analog signal range to about 2.5 volts when using a 5-volt power supply. In contrast, the architecture of the present invention provides a full 5-volt analog signal range.

(C) In the S.-H. Lee et al. article, the coarse ADC is used on both of the stages of conversion, whereas the architecture of the present invention employs the capacitor array in a successive-approximation conversion, and uses the coarse converter only to improve upon the initial guess/determination.

Figure 3:
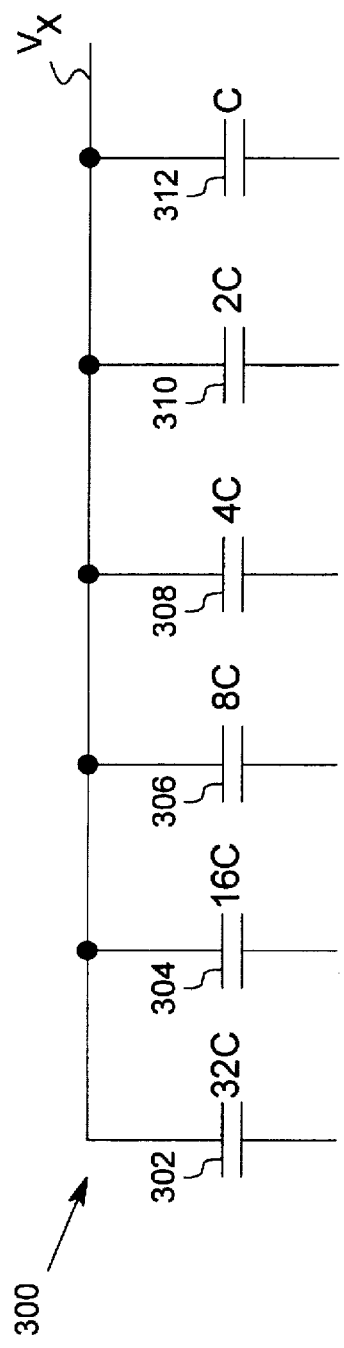
FIG. 3 is a schematic of an exemplary capacitor array 300 without redundancy, usable in a charge-redistribution analog-to-digital converter.

Like all two-step ADCs, some provision must be made to handle errors made by the coarse ADC in the first step. Code redundancy is the usual way this is handled. The basic idea is that errors in the most significant M bits can be compensated for if the subsequent conversion range is large enough. Without such a scheme, there would be little value in the ADC architecture described here, so some scheme had to be developed to build redundancy into the capacitor array. FIG. 3 shows a 6-bit version of the usual charge-redistribution capacitor array without built-in redundancy. The capacitance value of the unit capacitor, C, is not critical to this discussion. The important feature is that the ratio of any two capacitances is a power-of-two. The top-plate voltage caused by a voltage applied to the bottom plate of a capacitor having capacitance $2^k C$ is $2^{k-1}$ times as large as that produced by applying the same signal to the bottom plate of capacitor $2^1 C$.

Figure 4:
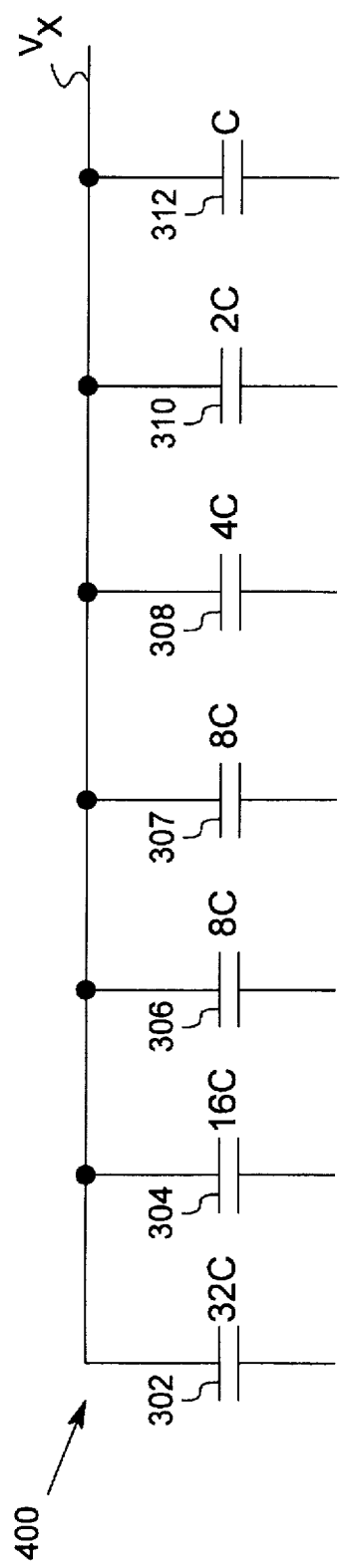
FIG. 4 is a schematic of an exemplary capacitor array 400 with a redundant 8C capacitor, usable in a charge-redistribution analog-to-digital converter.

FIG. 4 is an example of one embodiment of a 6-bit capacitor array that makes possible one bit of redundancy when operated as described below. (There are other equivalent capacitor structures that can provide the same feature.) Notice that the only difference between the array in FIG. 4 and the array in FIG. 3 is the extra 8C capacitance. Since this duplicate capacitor matches that of the 3rd MSB capacitor, this array would be applicable when the coarse ADC provides three bits of information about the analog-input-signal magnitude.

Figure 5A:
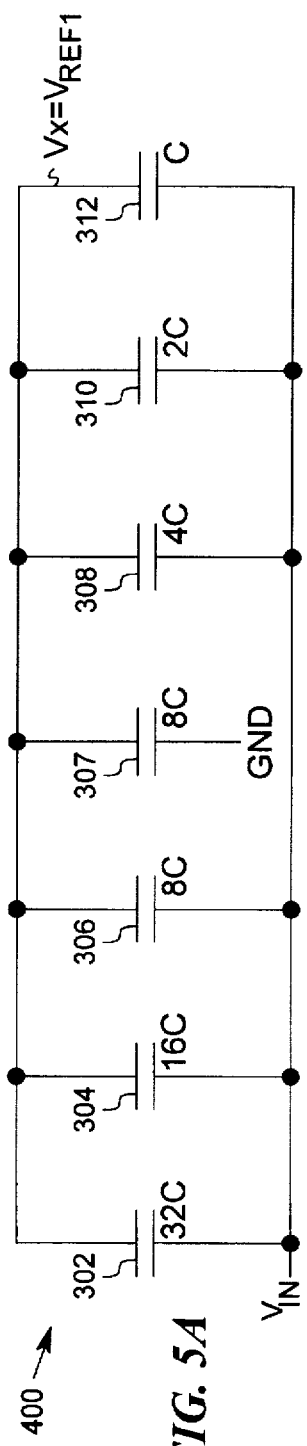
FIG. 5A is a schematic of an exemplary capacitor array 400 with redundancy, showing the voltages applied during input voltage sampling.
Figure 5B:
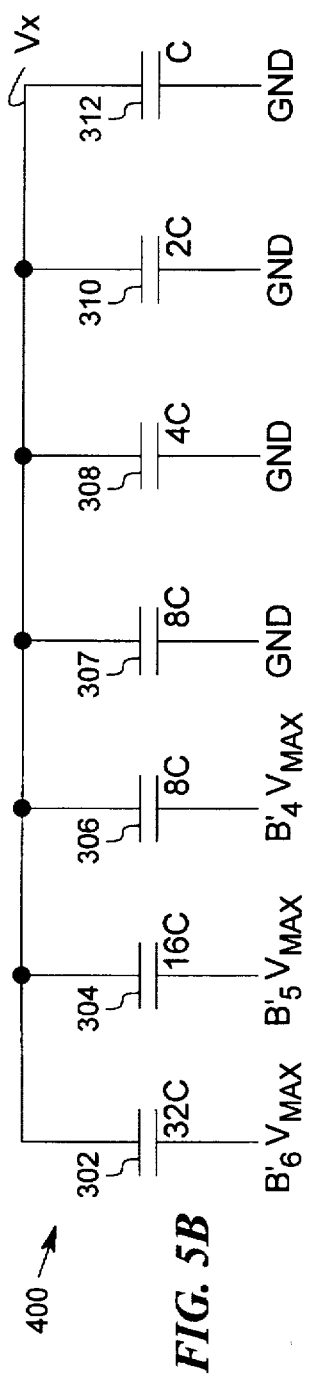
FIG. 5B is a schematic of an exemplary capacitor array 400 with redundancy, showing the voltages applied during conversion.
Figure 5C:
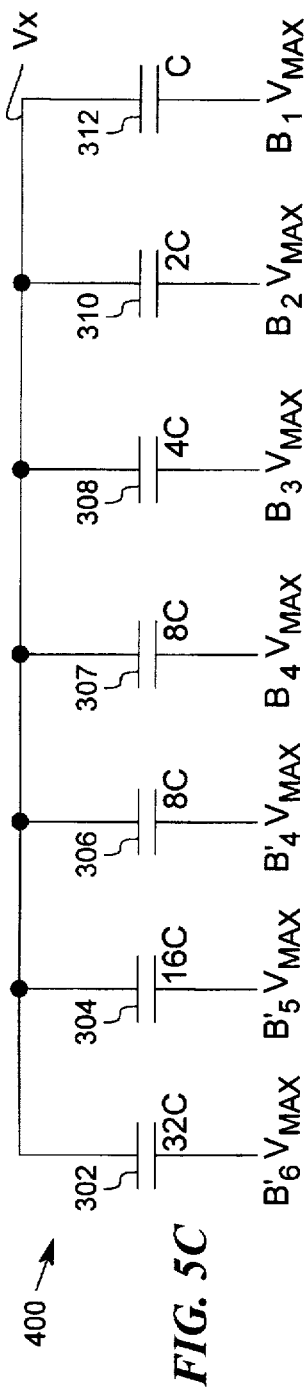
FIG. 5C is a schematic of an exemplary capacitor array 400 with redundancy, showing the voltages applied during conversion.

The following exemplary description of the operation of the array to provide one bit of redundancy is instructive. FIG. 5A shows the voltages on one embodiment of the capacitor array when the input signal is being sampled (during the "sampling period"). The top plate of capacitors is switched to the comparator reset voltage, $V_{REF1}$, while the analog input signal is switched to the bottom plates of all but the redundant 8C capacitor, capacitor 307. FIG. 5B shows the configuration of the array at a later point in time, when the successive-approximation algorithm begins, and FIG. 5C shows the configuration of the array at a still-later point in time, when it is complete. The coarse ADC 114 provides a three-bit estimate of the analog-input-signal magnitude represented by the 3-bit code $B''_6B''_5B''_4$ (in this case, M is three). A 3-bit code, 001 (since, in this case, M is three), is subtracted from the coarse ADC output, $B''_6B''_5B''_4$, to produce the 3-bit code, $B'_6B'_5B'_4$ that is applied to the three largest capacitors at the beginning of the conversion algorithm. In one such embodiment, the subtraction is merged with the function which encodes the M-bit binary code, as described below at FIG. 11A and 11B. In another such embodiment, more than one is subtracted from the M-bit value. (In these embodiments, the term "applying a code to the array" means that the bottom plate of the $k^{th}$ capacitor is switched to $V_{MAX}$ if $B'_k=1$, or to ground if $B'_k=0$.) Thus, for example, if the coarse ADC output were 101, the code 100 would be applied to the three MSB capacitors.

In one such embodiment, $V_{MAX}=V_{REF3}$ is typically 5 volts, $V_{REF2}$ is typically 0 volts (shown as GND in the Figures), and $V_{REF1}$ is typically 2.5 volts. In another embodiment, $V_{REF3}$ is typically 2.5 volts, $V_{REF2}$ is typically −2.5 volts, and $V_{REF1}$ is typically 0 volts. In these embodiments, providing accurate values for the voltages of $V_{REF3}$ and $V_{REF2}$ is critical to achieving an accurate result, but the accuracy of $V_{REF1}$ is less crucial.

After the 3-bit code, $B'_6B'_5B'_4$ is applied to the three largest capacitors, the remaining bits $B_4 \ldots B_1$ are determined by successive approximation in the usual way, leaving the array in the state shown in FIG. 5C. The redundancy is removed in the digital domain by combining the most-significant and least-significant bits in the same way that the capacitor array was operated. The resulting ADC output is $$D_{OUT}=2^3(B''_6 2^2+B''_5 2^1+B''_4-1)+B_4 2^3+B_3 2^2+B_2 2^1+B_1=2^3(B'_6 2^2+B'_5 2^1+B'_4)+B_4 2^3+B_3 2^2+B_2 2^1+B_1.$$

As previously indicated, this scheme makes use of the best attributes of two-step and successive-approximation ADCs. With only a small increase in circuit complexity (i.e., adding a coarse ADC) and without compromising any analog-input-signal range, the successive-approximation converter according to the present invention enjoys faster conversion, because there are fewer bits to determine by successive approximation and the conversion errors due to comparator hysteresis are eliminated because the comparator overdrive is limited.

U.S. Pat. No. 5,006,853 ("the '853 patent") employs a coarse ADC to eliminate hysteresis problems. The differences between that approach and the approach used in the present invention are:

(1) In the '853 patent, the coarse ADC is a 1-bit comparator connected to the top plate of the capacitor array and used repeatedly in a successive-approximation search for a coarse approximation to the input signal. This means that determination of the coarse approximation during the time the input-signal-sampling operation is being performed is impossible.

(2) In the '853 patent, the coarse approximation is made after the signal is sampled;

(3) In the '853 patent, there is no redundancy built into the capacitor array.

Method B

In general, the critical comparator decision corresponds to the least-significant ZERO bit if the LSB is a ONE, and to the least-significant ONE if the LSB is a ZERO. The present invention takes advantage of this in method B.

Method B is based upon the assumptions that the threshold hysteresis and the resulting time-dependent comparator offset have largely vanished by the end of the conversion and that a conversion error is caused by at most one erroneous comparator decision. These assumptions are natural conclusions drawn from the earlier discussion of Table 1. By the end of the conversion, the voltage difference at the comparator input is guaranteed to have been constrained to the same order of magnitude as the LSB step for several decision cycles. It is therefore reasonable to make the first assumption that the comparator has recovered from any earlier overdrive. The second assumption amounts to the observation that the hysteresis errors are 2–3 orders of magnitude smaller than the overdrive that produces them, so any erroneous comparator decision is only likely to occur at the critical comparator decision. After the critical decision, the voltage difference at the comparator input is sufficiently large to overcome any induced comparator-offset shift, and thus no error will result at those comparator-decision cycles. (For an error to occur, the magnitude of the induced comparator-offset shift must be larger than that of the voltage difference at the comparator input.)

Recall that the critical comparator decision corresponds to the least-significant ZERO bit if the LSB is a ONE, and the least-significant ONE if the LSB is a ZERO. The present invention takes advantage of this in method B. Suppose the resulting ADC output is XXX011...11, where XXX are any arbitrary MSB bits. It is assumed that the only error the comparator might have made is the least-significant ZERO, so the correct output might be XXX100 . . .. 00. Since the hysteresis effect has effectively vanished by the end of the conversion, one extra comparator-decision cycle can be added to the conversion in order to retest the code XXX100 . . . 00.

Figure 6:
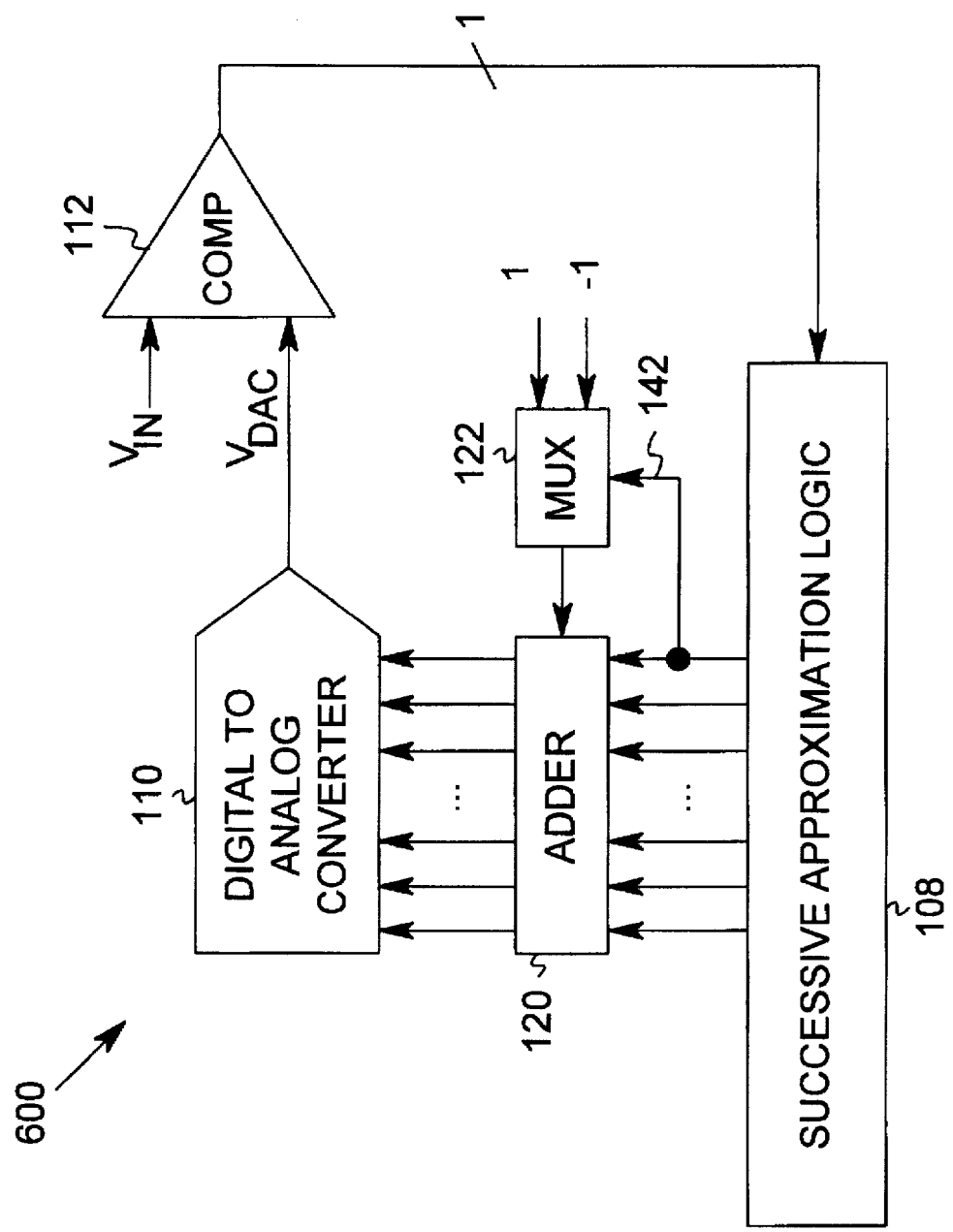
FIG. 6 is a block diagram of an exemplary analog-to-digital converter 600 with an adder 120 and multiplexor 122 used to correct comparator errors caused by hysteresis.

This can be done is one of two ways. In one embodiment, an adder is inserted between the SAR and the capacitor switch control logic, as shown in FIG. 6, and an extra comparator-decision cycle is added to the conversion process. When the comparator determines that the LSB is a ONE, the multiplexer and adder combine to add 000 . . . 01 to the SAR contents, and the comparator makes one last decision. Because the LSB is determined to be a ONE, the critical comparator decision is the least-significant ZERO, and adding 00 . . . 01 to the SAR causes the comparator to retest the critical-bit decision, this time without the overdrive it was subjected to the first time. If the comparator indicates that the critical bit is a ONE, then the ADC output becomes the adder output. If the comparator indicates a ZERO, then the ADC output is the SAR output.

When the LSB is determined to be a ZERO, it is known that the critical comparator decision occurred at the least-significant ONE. Thus, the critical bit can be retested by one extra comparator-decision cycle after the LSB is determined and reset to ZERO. If the comparator indicates that X100 . . . 00 is too large, then the multiplexer and adder combine to subtract 00 . . . 001 from the SAR to produce the ADC output. If the comparator indicates that X100 . . . 00 is not too large, then the ADC output is the SAR contents.

The multiplexer-and-adder scheme described above is one of many ways the correction algorithm can be realized. For example, increment/decrement logic could be used in place of the adder/multiplexer. The important concept is that an extra comparator-decision cycle is added to retest the critical-bit comparator decision at the end of the normal successive-approximation conversion process and the ADC output is corrected accordingly.

Figure 7:
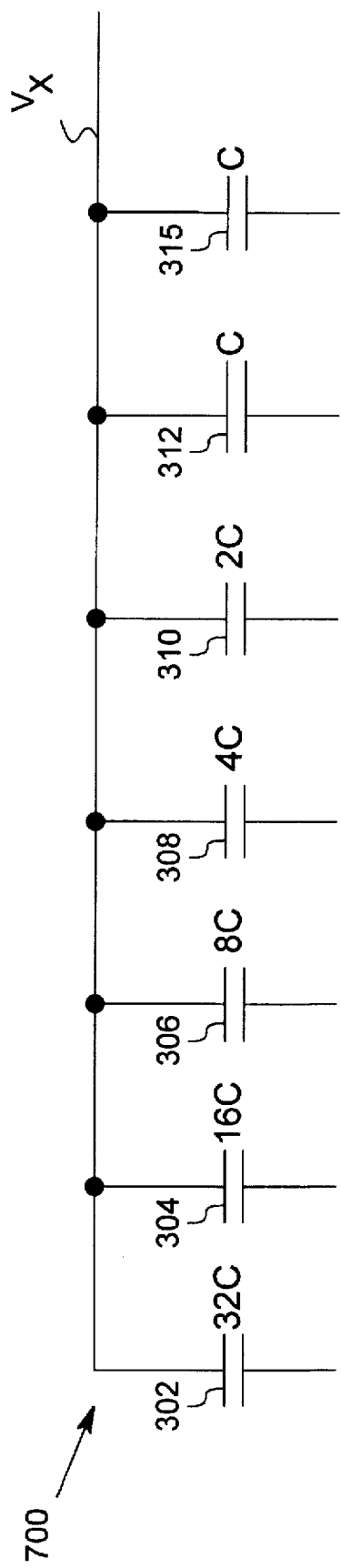
FIG. 7 is a schematic of an exemplary capacitor array 400 with a redundant 1C capacitor, usable in a charge-redistribution analog-to-digital converter.

In fact, the multiplexer/adder function can even be accomplished in the analog domain by adding an extra unit capacitor to the array as shown in FIG. 7. The bottom plate of the extra capacitor, capacitor 315 (which is redundant to capacitor 312), is connected to $V_{IN}$ during sampling, and is then normally grounded. When the retest of the critical comparator decision occurs, the bottom plate of capacitor 315 is switched to $V_{MAX}$ if the LSB is a ONE and held at ground if the LSB is a ZERO. This has the same effect as adding 00 . . . 001 to the value in the SAR if, and only if, the LSB is a ONE. If the retest indicates that the SAR contents must be incremented or decremented before becoming the ADC output, this increment or decrement must be accomplished with additional digital circuitry equivalent to the multiplexer/adder described above.

Figure 8:
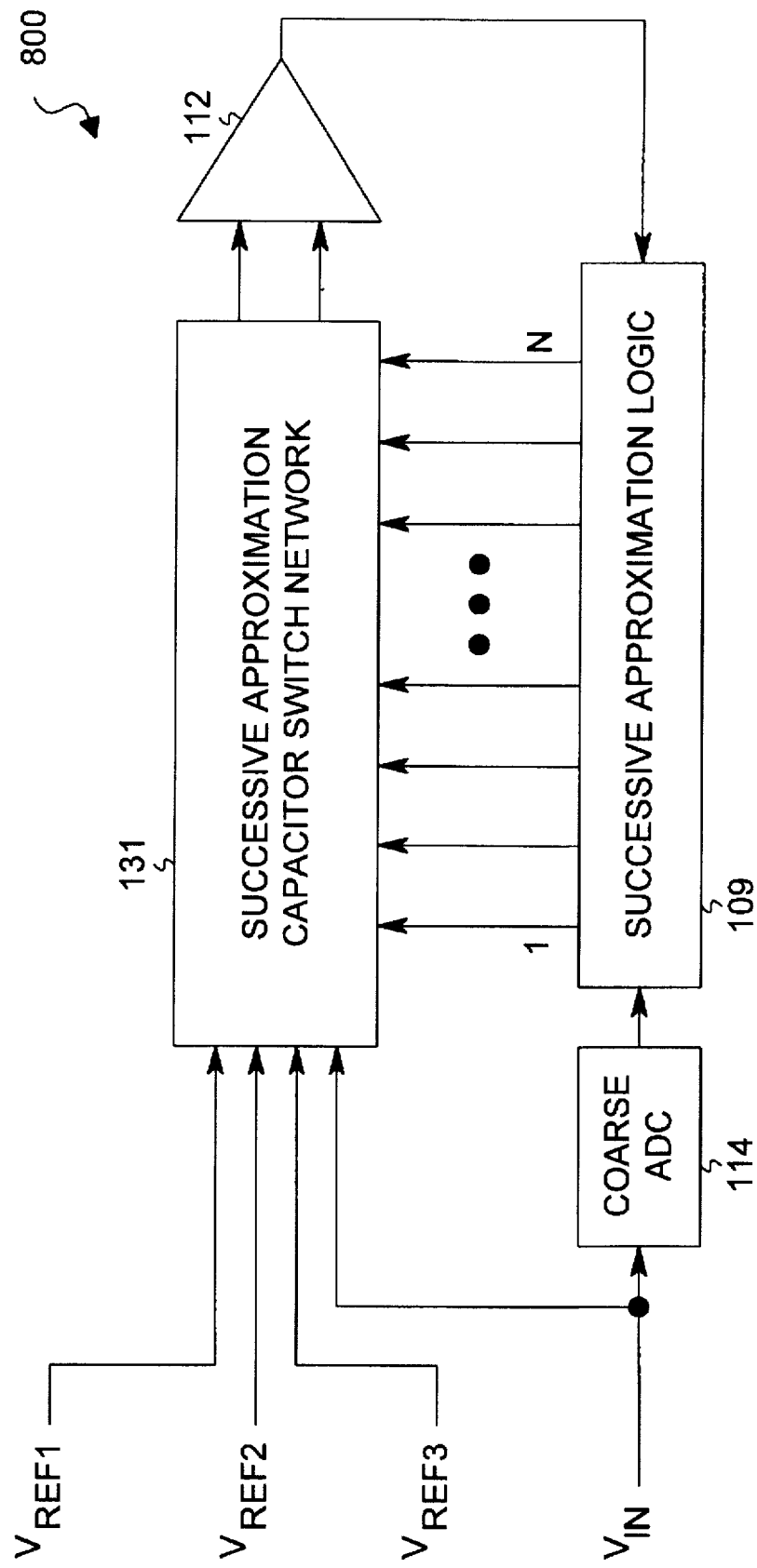
FIG. 8 is a block diagram of an exemplary charge-redistribution analog-to-digital converter 800 with a coarse ADC used to reduce comparator-hysteresis effects.

FIG. 8 is a simplified block diagram of an exemplary charge-redistribution analog-to-digital converter 800 with a coarse ADC used to reduce comparator-hysteresis effects.

Figure 9:
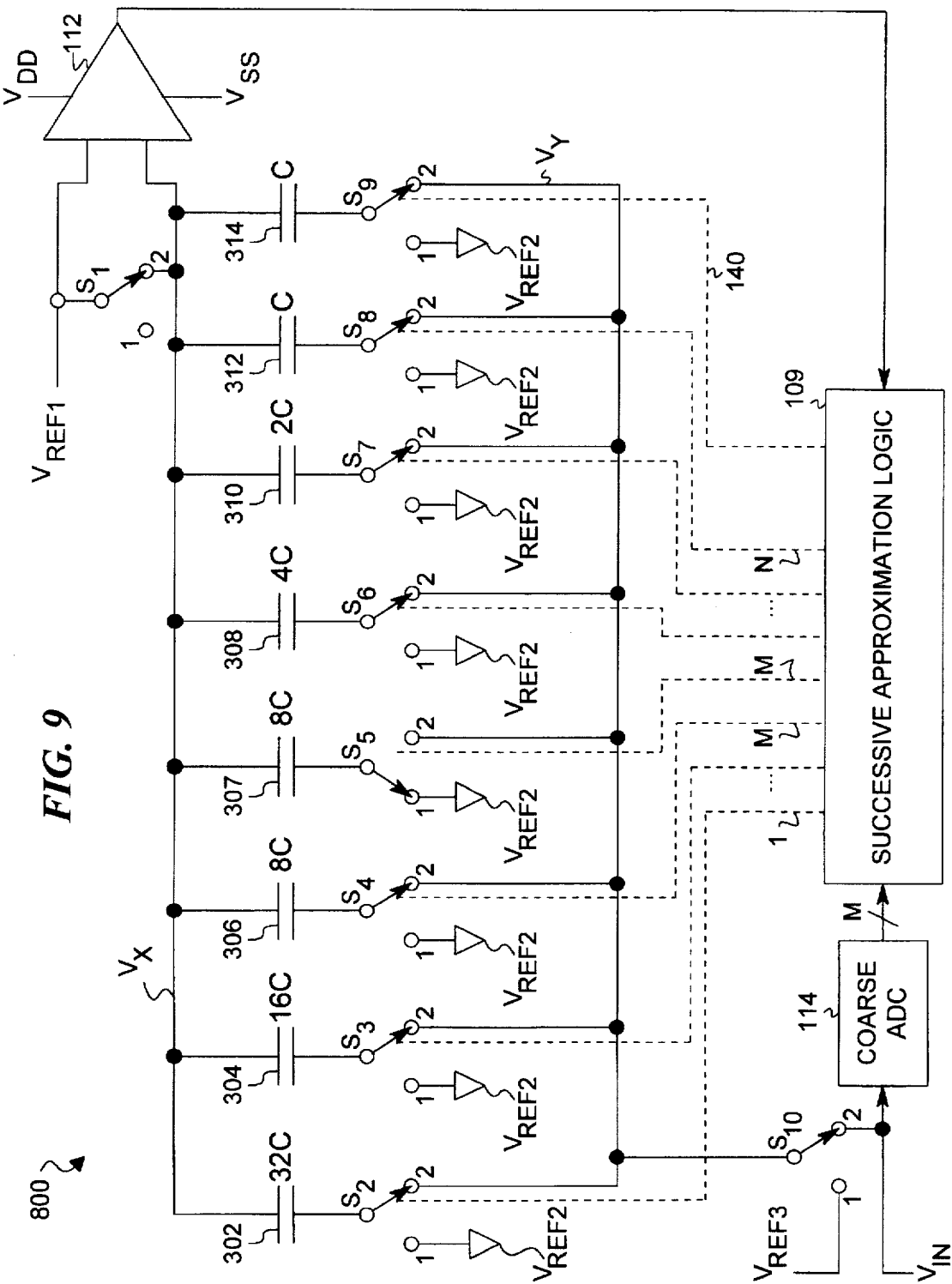
FIG. 9 is a schematic of an exemplary charge-redistribution analog-to-digital converter 800 with a redundant 8C capacitor and a redundant 1C capacitor.

FIG. 9 is a schematic of an exemplary charge-redistribution analog-to-digital converter 800 with a redundant 8C capacitor (i.e., capacitor 307), and a redundant 1C capacitor (i.e., capacitor 314). FIG. 9 will generate an N-bit digital value corresponding to input analog voltage $V_{IN}$. Input analog signal $V_{IN}$ is coupled to a first input of switch $S_{10}$, and also to the input of coarse ADC converter 114 which generates a plurality of M bits corresponding to M most-significant bits of the output digital value on said coarse output, wherein M is less than N. In one embodiment, M is three bits. Successive-approximation logic 109 has a first input connected to said output of comparator 112, a second input connected to the output of coarse ADC converter 114, and an (N+1)-bit digital output which is coupled to switches $S_2$ through $S_8$.

In the exemplary circuit shown in FIG. 9, N is six bits and M is three bits; however, a greater or fewer number of bits can be used to advantage for N; also a greater or fewer number of bits can be used to advantage for M. A plurality of capacitors 302 through 314 is provided, each one of this plurality of capacitors having a first plate and a second plate. (In FIG. 9, the upper connection —the first plate—on each capacitor is connected to node $V_x$, which is connected to comparator 112. The lower connection—the second plate— on each capacitor 302 through 314 is connected to a corresponding switch $S_2$ through $S_9$, respectively). Capacitor 307 provides a redundant capacitor to capacitor 306 at the Mth bit (in this example M is 3). Capacitor 314, in this example, is redundant to capacitor 312, but provides what is, in effect, a gain adjustment for node $V_x$: switch $S_9$ for capacitor 314 is set to position 2 during the sampling period of every conversion, and then switched to position 1 for the entire successive-approximation process (i.e., during the switching and testing of capacitors 307 through 312). This provides, in effect, a gain adjustment for node $V_x$.

Comparator 112 has a first input connected to reference-voltage signal $V_{REF1}$, a second input coupled to the first plate of every one of the plurality of capacitors 302 through 314 (node $V_x$), and an output which is coupled to successive-approximation logic 109.

At the start of the conversion process, switch $S_1$ initially shorts the two input terminals of comparator 112 in order to establish a sampled reference charge (this charge is proportional to the voltage difference between $V_{IN}$ and $V_{REF1}$) on capacitors 302 through 314. Switch $S_1$ is then opened and left open for the remainder of the conversion process.

As described above, in one embodiment, $V_{REF3}$ is typically 5 volts, $V_{REF2}$ is typically 0 volts, and $V_{REF1}$ is typically 2.5 volts. In another embodiment, $V_{REF3}$ is typically 2.5 volts, $V_{REF2}$ is typically −2.5 volts, and $V_{IN}$ is typically 0 volts. In these embodiments, providing accurate values for the voltages of $V_{REF3}$ and $V_{REF2}$ is critical to achieving an accurate result.

On the other hand, the value of $V_{REF1}$ is much less critical, but should be between $V_{REF3}$ and $V_{REF2}$. In one such embodiment, $V_{REF1}$ is roughly $(V_{REF3}+V_{REF2})/2$.

In one embodiment, ADC circuit 300 is fabricated in CMOS technology. In such an embodiment, switches $S_1$ through $S_{10}$ are typically solid-state devices, such as CMOS transmission gates.

Input switch $S_{10}$ has a common connection coupled to internal node $V_Y$ and is switchably coupled either to reference voltage $V_{REF3}$ or to the input analog signal. At the start of the conversion process, switch $S_{10}$ initially connects the analog input voltage $V_{IN}$ to internal node $V_Y$ in order to sample the input voltage and thus establish a reference charge on capacitors 302 through 314, excepting capacitor 307. In one embodiment, this sampling is performed during a "sampling period", which, in one such embodiment, is one clock period. In one such embodiment, the sampling period is typically 500 nanoseconds (ns). Switch $S_5$ is in position 1 during this sampling period, and thus capacitor 307 is charged to the voltage difference between $V_{REF1}$ and $V_{REF2}$ during the sampling period. At the end of the sampling period, switch $S_1$ opens. In one preferred embodiment, switch $S_{10}$ is then connected to reference voltage $V_{REF3}$ at a slight delay after switch $S_1$ opens, and is left connected to reference voltage $V_{REF3}$ for the remainder of the conversion process. In one such embodiment, this slight delay between switching $S_1$ and switching $S_{10}$ is typically approximately 5 to 10 ns using a circuit technology in which the conversion clock is typically on the order of 500 ns. This establishment of a reference charge provides a sample-and-hold function which leaves a charge, proportional to the input voltage $V_{IN}$, on capacitors 302 through 306 and 308 through 312 which will be measured during the analog-to-digital conversion process. In one embodiment, $S_9$ is switched to position 1 at substantially the same time that $S_{10}$ is switched to position 1, and switch $S_9$ is left in position 1 for the remainder of the conversion process.

The plurality of successive-approximation switches $S_2$ through $S_8$, each having a common connection coupled to the second plate of a corresponding one of the plurality of capacitors 302 through 312, respectively, are each switchably coupled either to reference voltage $V_{REF2}$ or to internal node $V_Y$ under the control of successive-approximation logic 109 during the conversion process. At the start of the conversion process (during the sampling period), switches $S_2$ through $S_4$ and $S_6$ through $S_9$ initially connect the corresponding second plates of capacitors 302 through 314, excepting capacitor 307, to internal node $V_Y$ in order to sample the input voltage and thus establish a reference charge on capacitors 302 through 314. Switches $S_2$ through $S_8$ are then switched, under the control of successive-approximation logic 109, as described below, between position 2 and position 1 to perform the conversion process.

Coarse ADC converter 114 has an input coupled to the input analog signal $V_{IN}$, and a digital output, wherein coarse ADC converter 114 generates a plurality of M bits. The value of these M bits corresponds to M most-significant bits of the output digital value. In a preferred embodiment, the M-bit digital value is decremented by one at the least-significant of those M bits. This M-bit decremented digital output is coupled to successive-approximation logic 109, wherein M is less than N.

In one such embodiment, coarse ADC converter 114 comprises a flash ADC, having $2^M$ comparators, each coupled to the respective nodes of a series-connected resistor chain which is coupled between $V_{IN}$ and ground. The $2^M$ comparators produce a "thermometer code" corresponding to the M most-significant bits of the desired digital output of ADC 300. This thermometer code is then converted by digital logic to an M-bit binary value, which is decremented by one and sent as output to successive-approximation logic 109. In one embodiment, the conversion from thermometer code to binary and the decrement by one is done as a single step, wherein the corresponding binary code converted to is one less than the M-bit digital value equal to the analog input.

Successive-approximation logic 109 has a first input, a second input, and a digital output, wherein the first input is connected to the output of comparator 112, the second input is connected to the digital output of coarse ADC converter 114, and the digital output is coupled to control the plurality of successive-approximation switches $S_2$ through $S_8$. In one embodiment, the digital output of successive-approximation logic 109 also controls switches $S_1$, $S_{10}$, and $S_9$.

In one such embodiment, in order to perform a conversion operation, switches $S_1$, $S_{10}$, $S_2$ through $S_4$, and $S_6$ through $S_9$ are all set to position 2, and $S_5$ is set to position 1, for the duration of an initial sampling period. In one such embodiment, this initial sampling period is typically 500 ns. During this initial sampling period, coarse ADC 114 also generates an M-bit value corresponding to the M most-significant bits of the digital value corresponding to $V_{IN}$, decremented by one, and couples this M-bit decremented value to successive-approximation logic 109. At the end of this initial sampling period, switch $S_1$ is set to position 1 (i.e., open), and then, after a slight delay (in this example, approximately 5 to 10 ns), switch $S_{10}$ is set to position 1 (i.e., coupled to $V_{REF3}$). A charge proportional to the difference between $V_{IN}$ and $V_{REF1}$ has thus been placed on capacitors 302–306 and 308–314; a charge proportional to the difference between $V_{REF2}$ and $V_{REF1}$ has been placed on capacitor 307.

Successive-approximation logic 109 then uses the decremented M-bit value from coarse ADC 114 to set the switches $S_2$ through $S_4$, corresponding to the high-order bits of the digital output result, and switch $S_9$ is set to position 1. For example, an input voltage $V_{IN}$=3.7635 volts (shown in Table 2 below, similar to row 1 of Table 1 above) would result, in one embodiment, in the high-order 3 bits being a binary value of 110, and after decrementing by one, coarse ADC 114 outputs a corresponding binary digital value of 101. Successive-approximation logic 109, using this binary value of 101, would set switches $S_2$ to position 2, $S_3$ to position 1, and $S_4$ to position 2; and would set switch $S_5$ to position 2 (corresponding to another one in the Mth bit position) and switches $S_6$–$S_8$ to position 1 (corresponding to zeros in all lower-significance-bit positions), for testing by comparator 112. In this example, this testing takes place in the next clock cycle, typically a 500 ns cycle in this example. Depending on the output of comparator 112, switch $S_5$ would be left in position 2 or set to position 1, and switch $S_6$ would then be set to position 2 for the next testing cycle. This process of setting a switch to position 2, testing, and possibly resetting the switch to position 1 is iteratively repeated until all bit positions have been determined. As a final step, the decremented most-significant bits (i.e., bits 1 through M) and the least-significant bits (i.e., bits M through N) are added together (aligning bits that have the same significance, i.e., bit M from the low-order bits is added to bit M of the high-order bits) to achieve the final digital result output by ADC circuit 800.

TABLE 2

Comparator bit decisions and input differential voltage as a function of ADC input and bit step in successive approximation.

| Bit Decision | $B_8$ (MSB) | $B_7$ | $B_6$ $B'_6$ | $B_5$ | $B_4$ | $B_3$ |
|---|---|---|---|---|---|---|
| $V_{in}$ = 3.7635 v output = binary 110000 | −1.2675 V | −19.5 mV | 604.5 mV | 292.5 mV | 136.5 mV | 58.5 mV |
| DECISION: | 1 | 1 | 0 | | | |
| $V_{in}$ = 3.7635 v Coarse = 101 | 1 | 0 | 1 | | | |
| $V_{in}$ = 3.7635 v | | | 1 | 0 | 0 | 0 |
| Combined Final Result | 1 | 1 | 0 | 0 | 0 | 0 |

Figure 1A:
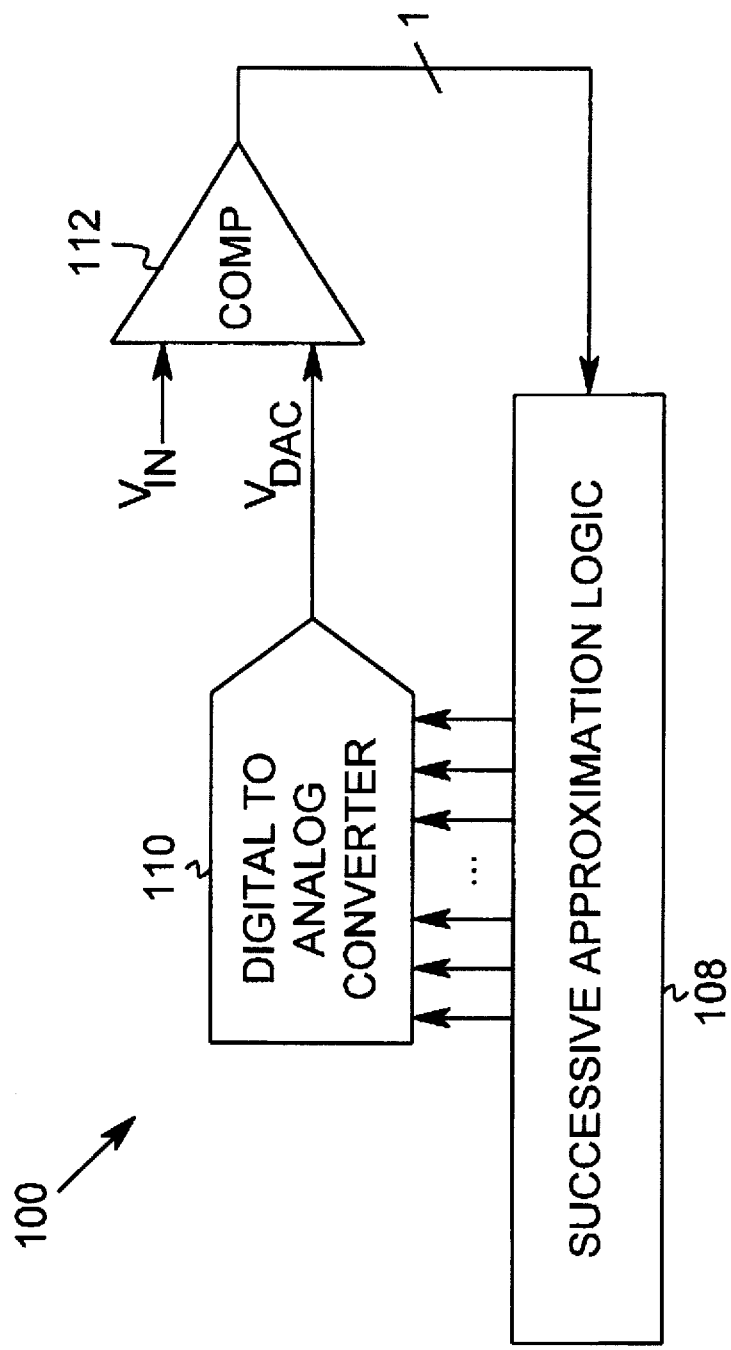
FIG. 1A is an exemplary generalized prior-art successive-approximation analog-to-digital converter 100.
Figure 1B:
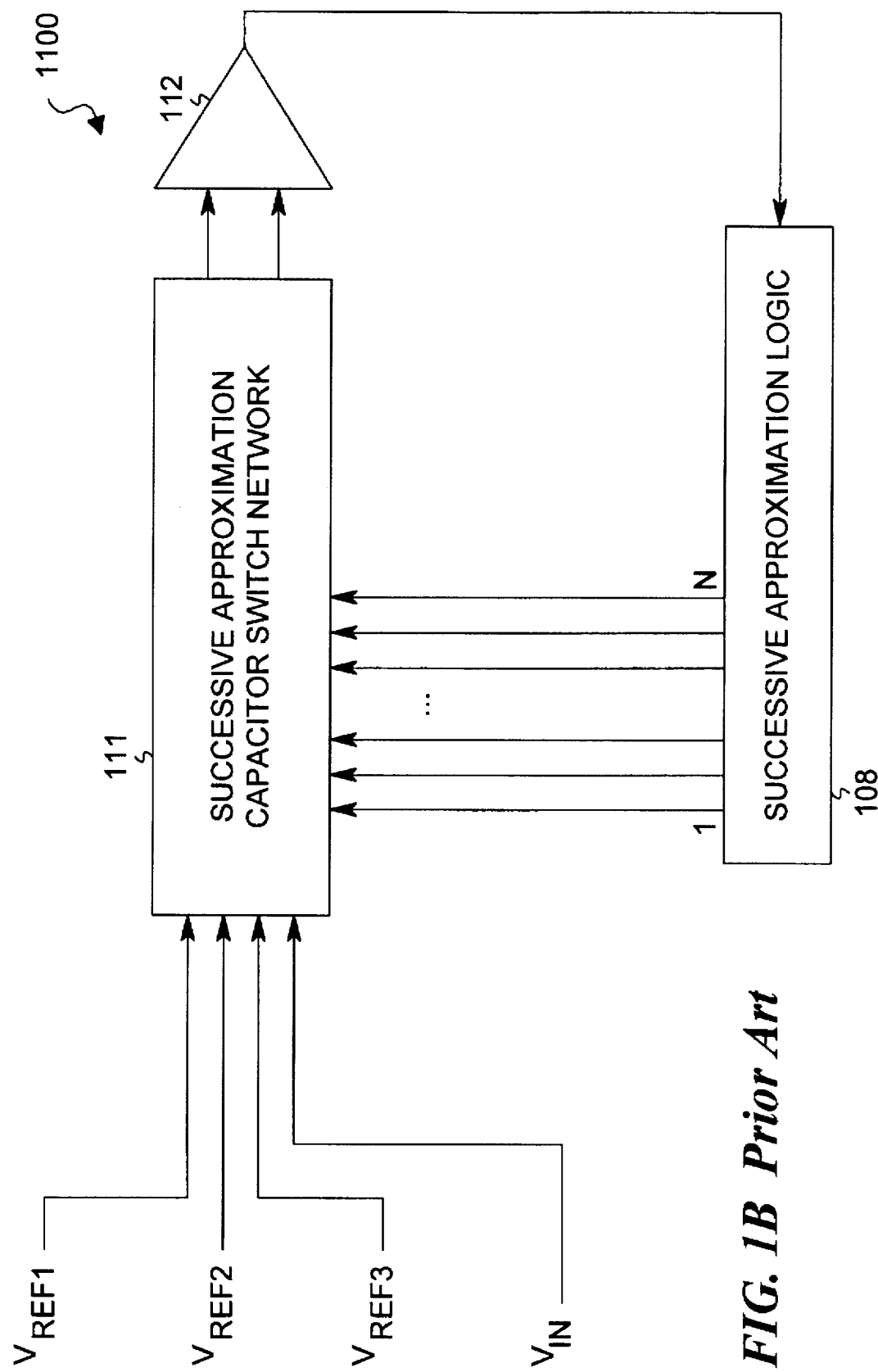
FIG. 1B is an exemplary generalized prior-art charge-redistribution successive-approximation analog-to-digital converter 1100.
Figure 10:
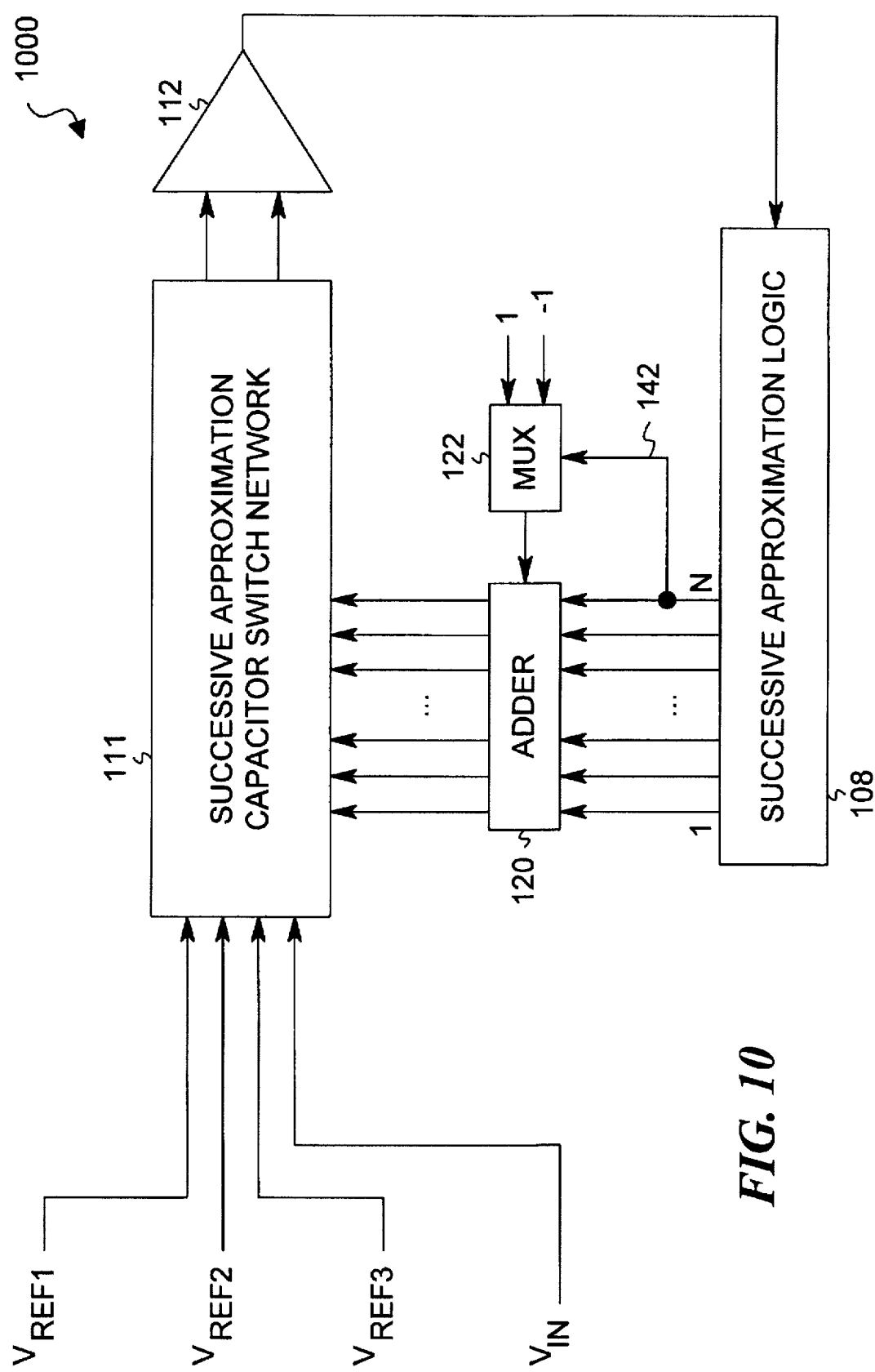
FIG. 10 is a block diagram of an exemplary charge-redistribution analog-to-digital converter 1000 with an adder 120 and multiplexor 122 used to correct comparator errors caused by hysteresis.

FIG. 10 is a block diagram of an exemplary charge-redistribution analog-to-digital converter 1000, similar to prior-art charge-redistribution successive-approximation analog-to-digital converter 1100 of FIG. 1B, but with an adder 120 and multiplexor 122 used to correct comparator errors caused by hysteresis. The operation of adder 120 and multiplexor 122 is identical to the operation of the corresponding parts described above for FIG. 6.

Figure 11A:
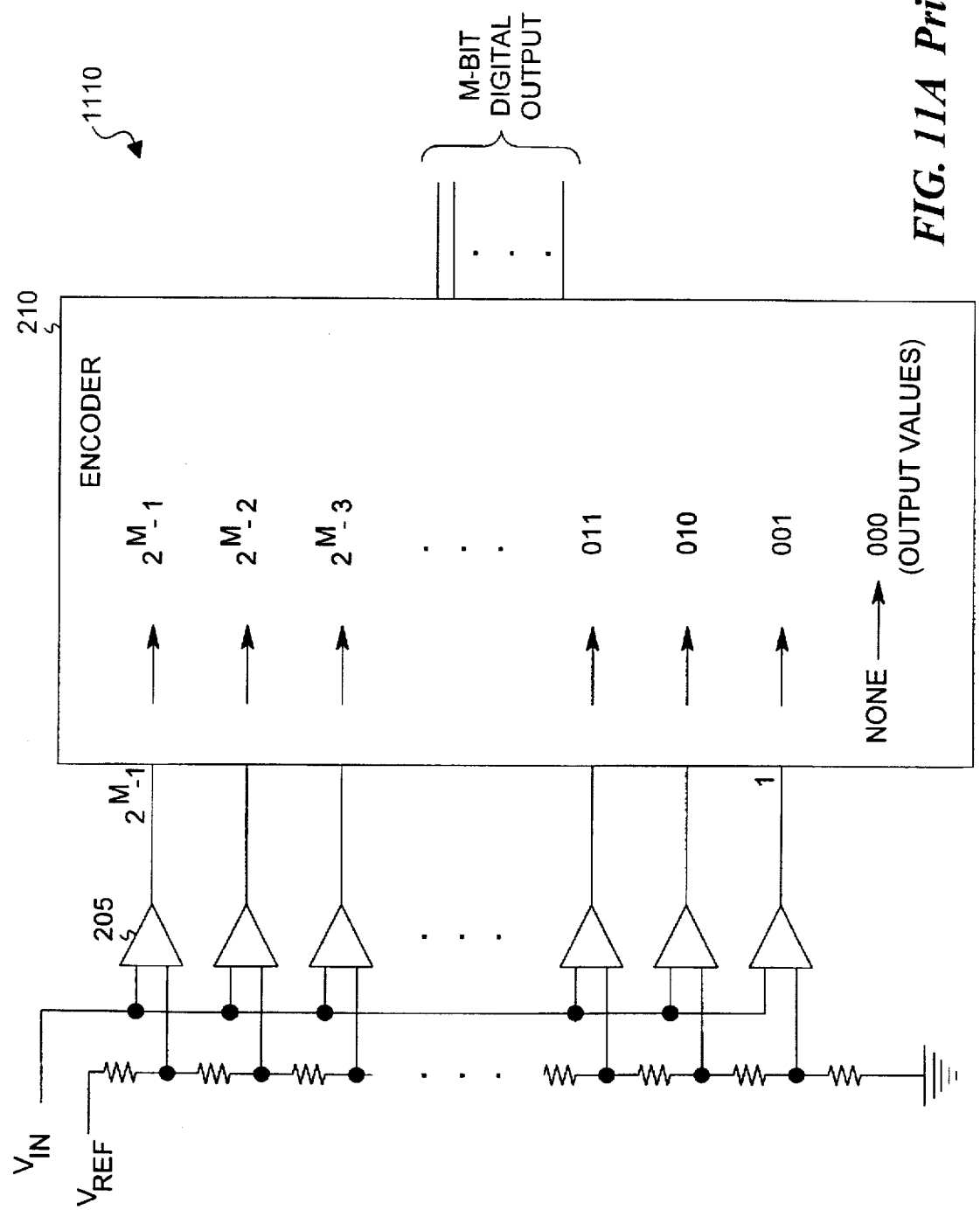
FIG. 11A is an exemplary generalized prior-art flash analog-to-digital converter 1110.

FIG. 11A is an exemplary generalized prior-art flash analog-to-digital converter 1110 usable as coarse ADC converter 114. Voltage $V_{REF}$ is typically divided across the plurality of resistors 202, wired in series to ground. Each resistor 202 typically has the same resistance as the others. The taps on this resistor string are used to provide one input to each of the plurality (numbering, typically, $2^M$) of comparators 205, the reference voltage applied to the input of a particular comparator 205 which is one LSB (relative to the bit resolution of the flash ADC 1110) difference between that of adjacent comparators. Analog input voltage $V_{IN}$ provides the other input to each comparator 205. The comparators 205 with tap voltages lower than $V_{IN}$ will all be "on," and those with tap voltages higher will all be "off," thus creating a "thermometer code." Encoder 220 encodes this thermometer code to generate an M-bit binary code corresponding to the number of comparators which are "on."

Figure 11B:
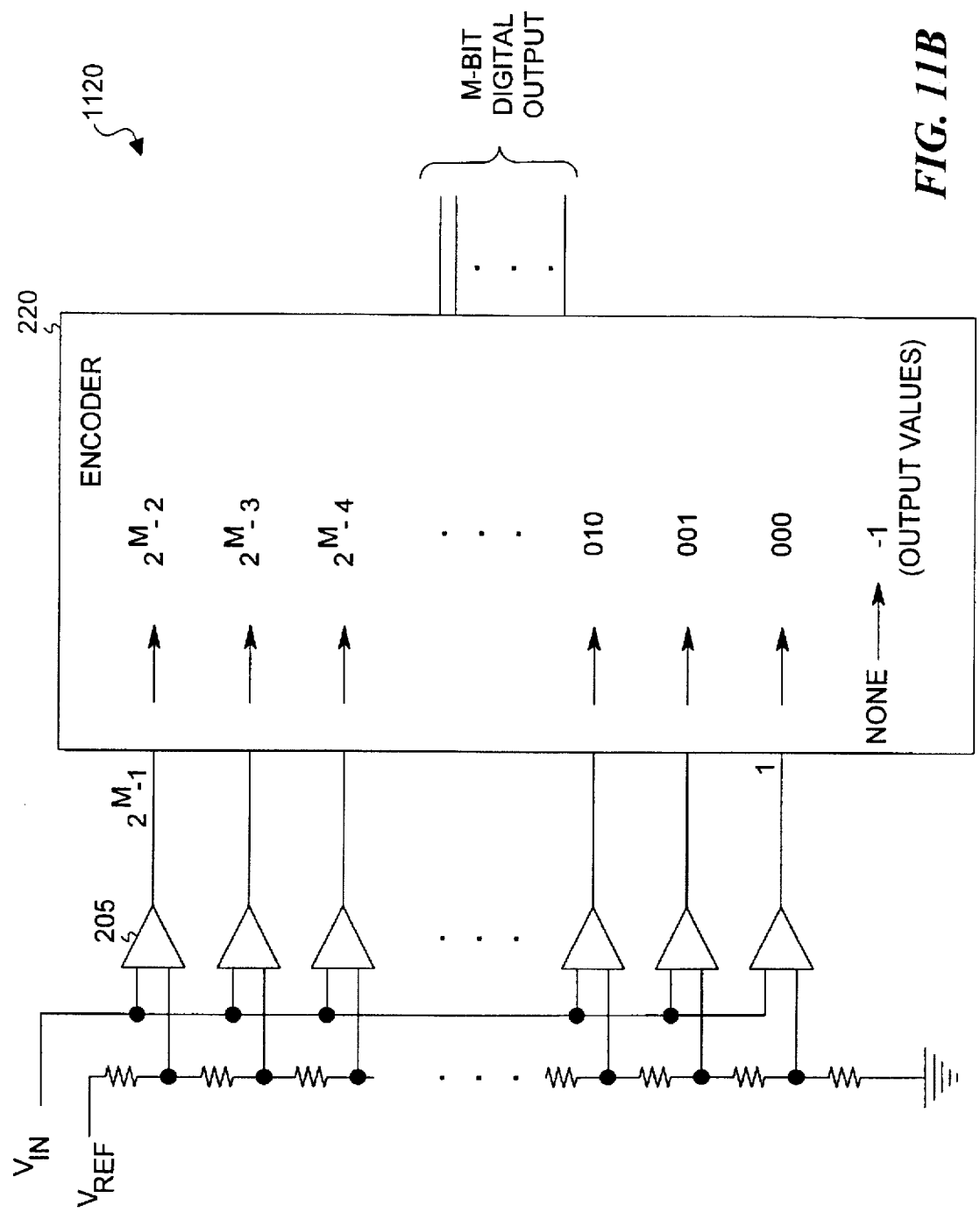
FIG. 11B is an exemplary generalized flash analog-to-digital converter 1120 usable as coarse ADC converter 114.

FIG. 11B is an exemplary generalized flash analog-to-digital converter 1120 usable as coarse ADC converter 114. Converter 1120 operates identically to convertor 1110 of FIG. 11A, except that the code generated corresponds to one less than the number of comparators which are "on," thus merging the ADC function and the decrement-by-one function. Thus, the inputs to the encoder are identical to those shown in FIG. 11A, but the encode provided by encoder 220 is a value that is one less than the value provided by encoder 210 in FIG. 11A. In one embodiment, encoder 220 also corrects for "bubbles" in the thermometer code (i.e., when a lower-significance comparator erroneously indicates "off" when higher-significance comparators are "on"). In a similar manner, other increment amounts, decrement amounts, or other encodings of the flash ADC output can be achieved by customizing the encode value corresponding to any particular number or pattern of comparators being "on".

The architecture used for coarse ADC 114 is not limited to flash ADCs such as converter 1120 only. In one preferred embodiment, the coarse ADC 114 performs a conversion within the one clock period used for the sampling period. Any architecture which performs the coarse conversion in a suitably fast time is usable in the present invention. Specifically contemplated for use in coarse ADC 114 are the following architectures: pipeline, folding, and serial/ripple-through, which are described in the following references, which are hereby incorporated by reference: Van de Plassche, *INTEGRATED ANALOG-TO-DIGITAL AND DIGITAL-TO-ANALOG CONVERTERS*, Kluwer Academic Publishers, Boston, 1994, and Carl W. Moreland, *AN 8b 150 M SAMPLE/S SERIAL ADC, IEEE International Solid-State Circuits Conference Digest of Technical Papers*, Vol. 38, P 272, 1995.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A successive-approximation analog-to-digital converter (ADC) circuit comprising:

a comparator having a first input coupled to an analog input signal that is to be converted into an ADC-digital-output value by the ADC circuit, said ADC-digital-output value having a plurality of N bits, a second input, and an output;

a coarse ADC converter having an input coupled to said analog input signal, and an M-bit coarse digital output, wherein said coarse ADC converter generates a plurality of M bits corresponding to M most-significant bits of said ADC-digital-output value on said M-bit coarse digital output, and wherein M is less than N;

successive-approximation logic having a first input connected to said output of said comparator, a second input connected to said M-bit coarse digital output, and an output; and a digital-to-analog converter having an input connected to said output of said successive-approximation logic and an analog output coupled to said second input of said comparator.

2. The successive-approximation ADC circuit according to claim 1 wherein said M-bit coarse digital output corresponds to an M-bit digital value, corresponding to said analog input signal, decremented by one.

3. The successive-approximation ADC circuit according to claim 1 wherein said successive-approximation ADC circuit operates with a sampling period of time followed by a successive-approximation search, and wherein said coarse ADC converter operates during said sampling period to provide a decremented M-bit coarse digital estimate of said analog input signal to said successive-approximation logic in order that said successive-approximation search begins at a digital value close to a correct result of said ADC-digital-output value, in order to minimize overdriving said comparator.

4. The successive-approximation ADC circuit according to claim 1 wherein said coarse ADC converter comprises a flash converter.

5. The successive-approximation ADC circuit according to claim 3 wherein said coarse ADC converter comprises a flash converter.

6. The successive-approximation ADC circuit according to claim 1, further comprising an incrementor/decrementor capable of selectively incrementing or decrementing said digital output of said successive-approximation logic.

7. The successive-approximation ADC circuit according to claim 6, wherein said ADC-digital-output value is determined as a reslt of:

(a) if at least-significant bit of said digital output of said successive-approximation logic is one, then incrementing said digital output of said successive-approximation logic in order to generate an incremented digital output value, and retesting the output of said comparator by comparing an analog signal corresponding to said incremented digital output value; else (b) if said least-significant bit of said digital output of said successive-approximation logic is zero, then retesting the output of said comparator by comparing an analog signal corresponding to said digital output.

8. The successive-approximation ADC circuit according to claim 6, wherein said ADC-digital-output value is determined as a result of:

(a) if a least-significant bit of said digital output of said successive-approximation logic is one, then incrementing said digital output of said successive-approximation logic in order to generate an incremented digital output value, and retesting the output of said comparator by comparing an analog signal corresponding to said incremented digital output value and if the retesting determined that the incremented digital value was not too high, then using the incremented digital output value as said ADC-digital-output value, else using the digital output as said ADC-digital-output value; else (b) if said least-significant bit of said digital output of said successive-approximation logic is zero, then retesting the output of said comparator by comparing an analog signal corresponding to said digital output and if the retesting determined that the digital output was not too high, then using the digital output as said ADC-digital-output value, else decrementing the digital output in order to generate a decremented digital output value and using said decremented digital output value as said ADC-digital-output value.

9. A successive-approximation analog-to-digital converter (ADC) circuit for reducing comparator-hysteresis effects while converting an input analog signal into an ADC-digital-output value, said ADC-digital-output value having a plurality of N bits, said circuit comprising:

a comparator having a first input, a second input, and an output;

a coarse ADC converter having an input coupled to said input analog signs, and an M-bit coarse digital output, wherein said coarse ADC converter generates a plurality of M bits corresponding to M most-significant bits of said ADC-digital-output value on said M-bit coarse digital output, and wherein M is less than N;

successive-approximation logic having a first input connected to said output of said comparator, a second input connected to said M-bit coarse digital output, and an output; and a digital-to-analog converter having an input connected to said output of said successive-approximation logic and an analog output coupled to said second input of said comparator;

wherein said digital-to-analog converter comprises a charge-redistribution converter coupled to said input analog signal, said charge-redistribution converter comprising a capacitor array, said capacitor array comprising a capacitor corresponding to each bit in the output digital value.

10. The successive-approximation ADC circuit according to claim 9 wherein said M-bit coarse digital output corresponds to an M-bit digital value, representative of said analog input signal, decremented by one.

11. The successive-approximation ADC circuit according to claim 10, said capacitor array further comprising a redundant capacitor.

12. The successive-approximation ADC circuit according to claim 11, wherein said redundant capacitor corresponds to an Mth most-significant bit of said output digital value.

13. The successive-approximation ADC circuit according to claim 12, wherein said output digital value is determined by combining said M-bit digital estimate with an ((N−M)+1)-bit successive approximation generated by said successive-approximation logic.

14. The successive-approximation ADC circuit according to claim 11, wherein said redundant capacitor corresponds to a least-significant bit of said output digital value.

15. The successive-approximation ADC circuit according to claim 14, wherein said output digital value is determined by adding one to said output of said successive-approximation logic if a least-significant bit of said output of said successive-approximation logic is one, and retesting the output of said comparator.

16. A method for reducing comparator-hysteresis effects while performing successive-approximation analog-to-digital conversion of an input analog signal into an output digital value, said output digital value having a plurality of N bits, said method comprising the steps of:

(a) performing a coarse analog-to-digital conversion to generate a plurality of M bits corresponding to M most-significant bits of said output digital value, wherein M is less than N, wherein the step of performing a coarse analog-to-digital conversion includes the substantially simultaneous step of sampling said input analog signal to obtain a sampled analog signal;

(b) coupling said M bits to an internal digital approximation value;

(c) converting said internal digital approximation value to a corresponding internal analog signal;

(d) comparing said internal analog signal to said sampled analog signal to obtain a test result;

(e) generating a next-most-significant bit of said internal digital approximation value as a function of said test result;

(f) successively approximating said output digital value by iteratively repeating steps (c), (d), and (e).

17. The method according to claim 16 wherein said plurality of M bits corresponds to an M-bit digital value, corresponding to said analog input signal, decremented by one.

18. The method according to claim 17 wherein said successive-approximation conversion is performed with a sampling period of time followed by a successive-approximation search, and wherein said coarse analog-to-digital conversion operates during said sampling period in order to minimize overdrive during said comparing step.

19. The method according to claim 17 wherein said converting step (c) comprises the step of using a charge-redistribution converter, said charge-redistribution converter comprising a capacitor array, said capacitor array comprising a capacitor corresponding to each bit in the output digital value.

20. The method according to claim 19, said capacitor array further comprising a redundant capacitor.

21. The method according to claim 20, wherein said redundant capacitor corresponds to an Mth most-significant bit of said output digital value.

22. The method according to claim 21, further comprising the step of determining said output digital value by combining said M-bit digital estimate with an ((N−M)+1)-bit successive approximation generated by steps (c)–(f).

23. A method for reducing comparator-hysteresis effects while performing successive-approximation analog-to-digital conversion of an input analog signal into an output digital value, said output digital value having a plurality of N bits, said method comprising the steps of:

(a) generating an initial internal digital approximation value;

(b0) if a least-significant bit of said initial internal digital approximation value is zero, then (c0) converting said initial internal digital approximation value to a corresponding initial internal analog signal;

(d0) subtracting a decrement value from said initial internal digital approximation value to obtain a decremented internal digital approximation value;

(e0) comparing said initial internal analog signal to said input analog signal to obtain a first test result; and (f0) generating said output digital value from either said initial internal digital approximation value or said decremented internal digital approximation value, based on said first test result; and (b1) if said least-significant bit of said initial internal digital approximation value is one, then (c1) adding an increment value to said initial internal digital approximation value to obtain an incremented internal digital approximation value;

(d1) converting said incremented internal digital approximation value to a corresponding incremented internal analog signal;

(e1) comparing said incremented internal analog signal to said input analog signal to obtain a second test result; and (f1) generating said output digital value from either said initial internal digital approximation value or said incremented internal digital approximation value, based on said second test result.

24. The method according to claim 23 wherein said converting steps (c0) and (d1) each comprise the step of using a charge-redistribution converter, said charge-redistribution converter comprising a capacitor array, said capacitor array comprising a capacitor corresponding to each bit in the output digital value.

25. The method according to claim 24, said capacitor array further comprising a redundant capacitor.

26. The method according to claim 25, wherein said redundant capacitor corresponds to a least-significant bit of said output digital value.

27. An analog-to-digital converter (ADC) circuit comprising:

a comparator having a first input coupled to a first reference voltage, a second input, and an output;

a coarse ADC converter having an input coupled to an analog input signal that is to be converted into an ADC-digital-output value by the ADC circuit, said ADC-digital-output value having a plurality of N bits, and a coarse digital output, wherein said coarse ADC converter generates an M-bit decremented digital estimate corresponding to said analog input signal, on said coarse digital output, wherein M is less than N;

successive-approximation logic having a first input connected to said output of said comparator, a second input connected to said coarse digital output of said coarse ADC converter, and an output; and a switched capacitor network having a sampling input, a control input, and an analog output, wherein:

said sampling input is switchably coupled to said input analog signal, said control input is connected to said output of said successive-approximation logic, and said analog output is connected to said second input of said comparator.

28. The ADC circuit according to claim 27 wherein said ADC circuit operates with a sampling period of time followed by a successive-approximation search, and wherein said coarse ADC converter operates during said sampling period to provide said M-bit decremented digital estimate to said successive-approximation logic in order that said successive-approximation search can begin at a digital value close to a correct result of said output digital value in order to minimize overdriving said comparator.

29. The ADC circuit according to claim 27 wherein said switched capacitor network comprises a capacitor corresponding to each bit in the output digital value.

30. The ADC circuit according to claim 29, said capacitor array further comprising a redundant capacitor.

31. The ADC circuit according to claim 30, wherein said redundant capacitor corresponds to an Mth most-significant bit of said output digital value.

32. The ADC circuit according to claim 31, wherein said output digital value is determined by combining said M-bit decremented digital estimate with an ((N−M)+1)-bit successive approximation generated by said successive-approximation logic.

33. The successive-approximation ADC circuit according to claim 27, wherein said output digital value is determined by if a least-significant bit of said output of said successive-approximation logic is one, then adding one to said output of said successive-approximation logic and retesting the output of said comparator; and if said least-significant bit of said output of said successive-approximation logic is zero, then retesting the output of said comparator, and subtracting one from said output of said successive-approximation logic.

34. The successive-approximation ADC circuit according to claim 30, wherein said redundant capacitor corresponds to a least-significant bit of said output digital value.

35. The successive-approximation ADC circuit according to claim 34, wherein said output digital value is determined by adding one to said output of said successsive-approximation logic if a least-significant bit of said output of said successive-approximation logic is one and retesting the output of said comparator.

36. A method for reducing comparator-hysteresis effects while performing successive-approximation analog-to-digital conversion of an input analog signal into an output digital value, said output digital value having a plurality of N bits, said method comprising the steps of:

(a) performing a coarse analog-to-digital conversion to generate a plurality of M bits corresponding to M most-significant bits of a digital value corresponding to said analog input signal, decremented by one, wherein M is less than N;

(b) coupling said M bits to an internal digital approximation value;

(c) converting said internal digital approximation value to a corresponding internal analog signal;

(d) comparing said internal analog signal to a reference signal to obtain a test result;

(e) generating a next-most-significant bit of said internal digital approximation value as a function of said test result;

(f) successively approximating said output digital value by iteratively repeating steps (c), (d), and (e).

37. The method according to claim 36 wherein said successive-approximation conversion is performed with a sampling period of time followed by a successive-approximation search period of time, and wherein said coarse analog-to-digital conversion operates during said sampling period.

38. The method according to claim 36 wherein said converting step (c) comprises the step of using a charge-redistribution converter, said charge-redistribution converter comprising a capacitor array, said capacitor array comprising a capacitor corresponding to each bit in the output digital value.

39. The method according to claim 38, said capacitor array further comprising a redundant capacitor.

40. The method according to claim 39, wherein said redundant capacitor corresponds to an Mth most-significant bit of said output digital value.

41. The method according to claim 40, further comprising the step of determining said output digital value by combining said M-bit decremented digital estimate with an ((N−M)+1)-bit successive approximation generated by steps (c)−(f).

42. A charge-redistribution successive-approximation analog-to-digital converter (ADC) circuit for reducing comparator-hysteresis effects while converting an input analog signal into an output digital value, said output digital value having a plurality of N bits, said circuit comprising:

a plurality of capacitors, each one of said plurality of capacitors having a first plate and a second plate;

a comparator having a first input connected to a first reference voltage signal, a second input coupled to said first plate of every one of said plurality of capacitors, and an output;

a plurality of successive-approximation switches, each one of said plurality of successive-approximation switches having a common connection coupled to said second plate of a corresponding one of said plurality of capacitors and switchably coupled either to a second reference voltage or to an internal node;

an input switch having a common connection coupled to said internal node and switchably coupled either to a third reference voltage or to said input analog signal;

a coarse ADC converter having an input coupled to said input analog signal, and a digital output, wherein said coarse ADC converter generates a plurality of M bits corresponding to M most-significant bits of said output digital value on said digital output, wherein M is less than N; and successive-approximation logic having a first input, a second input, and a digital output, wherein said first input is connected to said output of said comparator, said second input is connected to said digital output of said coarse ADC converter, and said digital output is coupled to control said plurality of successive-approximation switches.

* * * * *